United States Patent
Funato et al.

(10) Patent No.: US 7,911,806 B2
(45) Date of Patent: Mar. 22, 2011

(54) METHOD AND APPARATUS FOR REDUCING EMI EMISSIONS FROM A POWER INVERTER

(75) Inventors: Hiroki Funato, Yokohama (JP); Liang Shao, Ann Arbor, MI (US); Makato Torigoe, West Bloomfield, MI (US)

(73) Assignee: Hitachi, Ltd, Tokyo (JP)

( * ) Notice: Subject to any disclaimer, the term of this patent is extended or adjusted under 35 U.S.C. 154(b) by 844 days.

(21) Appl. No.: 11/864,341

(22) Filed: Sep. 28, 2007

(65) Prior Publication Data

US 2009/0086462 A1 Apr. 2, 2009

(51) Int. Cl.
*H05K 9/00* (2006.01)

(52) U.S. Cl. ........ 361/818; 361/816; 361/800; 361/799; 361/753; 174/350; 174/376

(58) Field of Classification Search .......... 361/752, 361/753, 799, 800, 816, 818; 174/350, 376, 174/385
See application file for complete search history.

(56) References Cited

U.S. PATENT DOCUMENTS

| | | | |
|---|---|---|---|
| 3,339,948 A | | 9/1967 | Weitzel |
| 4,658,334 A | * | 4/1987 | McSparran et al. .......... 361/800 |
| 6,101,089 A | * | 8/2000 | Seto et al. ................ 361/679.47 |
| 6,462,958 B2 | * | 10/2002 | Ogata ........................... 361/800 |
| 2006/0119512 A1 | | 6/2006 | Yoshimatsu et al. | |

FOREIGN PATENT DOCUMENTS

| | | |
|---|---|---|
| DE | 19735531 A1 | 2/1999 |
| JP | 01013752 A | 1/1989 |
| JP | 07131978 A | 5/1995 |
| JP | 2002270748 A | 9/2002 |
| WO | WO-0041451 A1 | 7/2000 |

OTHER PUBLICATIONS

European Search Report dated Apr. 20, 2010.

* cited by examiner

*Primary Examiner* — Dameon E Levi
(74) *Attorney, Agent, or Firm* — Gifford, Krass, Sprinkle, Anderson & Citkowski, P.C.

(57) ABSTRACT

A power inverter for a hybrid automotive vehicle having a case with an interior and at least one electrical port mounted on the case to electrically connect electrical signals from the interior of the case to an exterior device. A cable connector is associated with each electrical port while a non-electrical sensing conductor extends serially through each electrical port and its associated cable connector. A circuit is provided which detects a break in the continuity of the sensing conductor and generates a signal representative of that break in continuity. The non-electrical sensing conductor thus minimizes the emission of EMI from the inverter. Additionally, a circuit board is mounted within the interior of the case by fasteners which minimize the spacing between the circuit board and the case to further reduce EMI emissions.

6 Claims, 6 Drawing Sheets

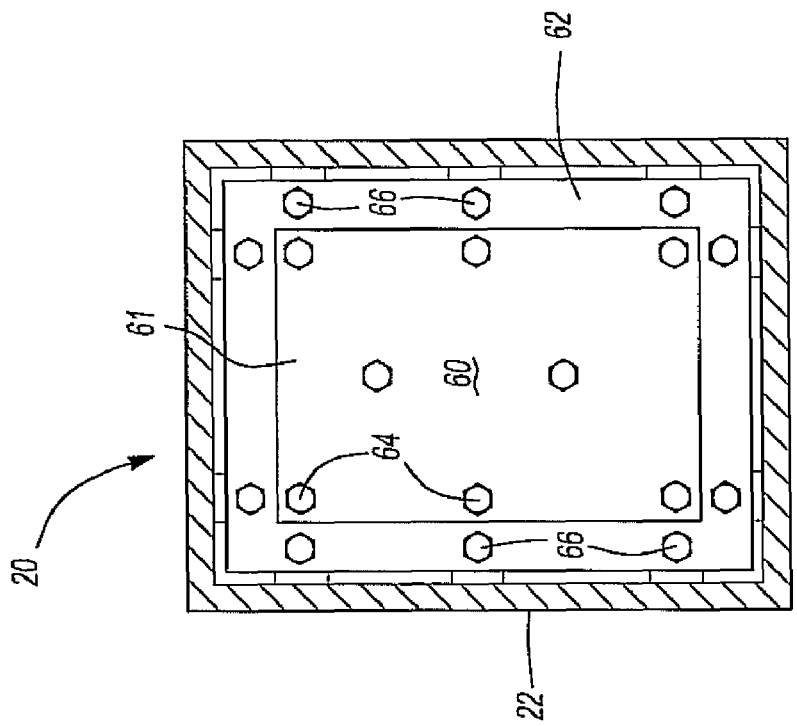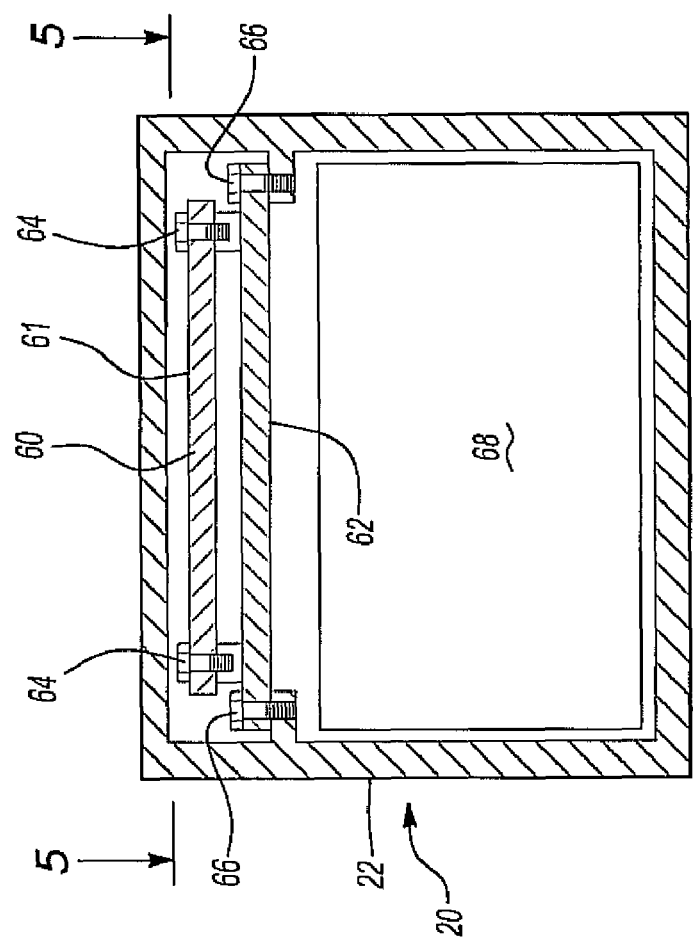

METHOD AND APPARATUS FOR REDUCING EMI EMISSIONS FROM A POWER INVERTER

BACKGROUND OF THE INVENTION

I. Field of the Invention

The present invention relates generally to a method and apparatus for minimizing electromagnetic interference (EMI) from a power inverter of an electric vehicle.

II. Description of Related Art

Electrically powered automotive vehicles, and especially hybrid automotive vehicles, are becoming increasingly popular due to the fuel economy achieved by such vehicles.

All such electric vehicles utilize a power inverter to power the electric motor for the vehicle. These power inverters must be capable of producing relatively high power outputs, typically 50 horsepower or more. As such, the power inverters necessarily must be capable of switching high current loads.

A major source of EMI radiation from the power inverter arises from the ground bouncing of the control circuit and its base plate for the power inverter. Conventionally, the circuit board, which has its own ground plane, is mounted to a metallic base plate by first fasteners. Second fasteners are then used to secure the base plate to the power inverter case.

Ideally, the ground plane for the control circuit will be identical to the ground plane for the inverter case. In practice, however, relatively wide spacing occurs between the first and second fasteners. This relatively wide spacing gives rise to parasitic inductance between the ground plane of the control circuit and the case. At the high switching frequencies utilized by power inverters, these parasitic inductances result in the generation of EMI. When the drivers/switches of hybrid control circuit drive the electric motors or loads outside inverter, all return currents flow through the inverter case and the base plate of the board. In addition, the common mode return current from motor PWM switching also flow through the same path as other return current. Then, the parasitic inductance of the return path causes the voltage bouncing on the ground of the motor control board due to the return current flow. The voltage bouncing of ground creates significant noises for radiated and conducted emission from inverter system.

Also many bus bars are deployed to carry very high currents and become the source of magnetic field inside the power inverter enclosure, which couple with other signal harness to generate additional conducted emissions. All these noises accumulate and male it more difficult to pass OEM EMC/EMI requirement in component/vehicle level EMC test. Therefore, the effective EMC noise attenuation method is important to manufacture high quality power inverter module for HEV application.

For safety reasons, the power inverter is typically housed in a metal case having one or more electrical ports, each of which is adapted to be connected to an external electrical load by a cable connector. Such power inverters also include a control circuit mounted to a circuit board which is also contained within the interior of the case for the power inverter.

One disadvantage of the previously known electric vehicles, however, is that the high voltage and high amperage switching within the interior of the power inverter generates extensive electro-magnetic fields as well as electromagnetic interference (EMI). Such EMI can cause interference to components of the vehicle, such as radio interference, and in extreme cases may interfere with the operation of the vehicle itself.

Another source of EMI in the power inverter results from the operation of the high voltage interlock (HVIL) system of the power inverter. In the conventional HVIL system, an electrical sensing wire extends serially to each electrical port on the power inverter case. When an electrical connector is properly attached to its associated electrical port, the electrical connector completes the connection for the HVIL sensing wire thus maintaining continuity of the circuit. The HVIL sensing wire is coupled to a circuit which monitors the electrical continuity of the HVIL sensing wire.

Consequently, in operation, in the event that a cable connector becomes disconnected from its associated electrical port thus posing a potential safety hazard, the electrical continuity of the HVIL sensing wire is interrupted. This interruption in turn is detected by the circuit which then takes the appropriate action, e.g. shutting down the high voltage and high amperage circuitry of the power inverter.

While the operation of the previously known power inverters with an HVIL system provides adequate safety for the power inverter by detecting a disconnected cable connector, the high magnetic switching fields within the interior of the power inverter case in turn induce high frequency signals into the sensing wire for the HVIL system. The HVIL sensing wire in turn generates extensive EMI which is generated exteriorly of the power inverter case since a portion of the HVIL sensing wire extends through each cable connector and thus exteriorly of the inverter case.

SUMMARY OF THE PRESENT INVENTION

The present invention provides both a method and apparatus which overcomes the above-mentioned disadvantages of the previously known inverters. This is accomplished primarily by improving the ground between the motor control board ground and the case which, in turn, reduces parasitic inductances which can result in EMI at the high frequencies employed by power inverters.

In order to reduce the emission of EMI from the power inverter caused by the mounting of the control circuit within the interior of the power inverter, the present invention also minimizes the distance between the fasteners which secure the circuit board to its base plate and the second fasteners which secure the base plate to the power inverter case. By minimizing such distance, parasitic inductance between the ground plane of the control circuit and the power inverter case is also minimized.

One way to achieve such minimization is to use a single fastener which extends both through the control circuit board and base plate into the case. Similarly, the control circuit board may be mounted directly to the case which also minimizes stray inductances and the resulting emission of EMI. Also, better grounding may be obtained by minimizing the length of the grounding path. Similarly, increasing the area of contact between the ground plane of the control circuit and all of the components in the ground path between the ground plane of the control circuit and the case also minimizes the emission of EMI.

The power inverter of the present invention includes a case having an interior and at least one, and more typically several, electrical ports mounted to the case. A cable connector is associated with each of the electrical ports for connecting an electrical signal from the power inverter to an external electrical load.

The present invention also utilizes a high voltage interlock (HVIL) system for detecting the disconnection of a connector from its associated electrical port on the case. An optical cable forms the non-electrical sensing conductor for the HVIL system. In the event that a cable connector is disconnected, the continuity of the optical circuit is interrupted and this interruption is detected by circuitry within the power inverter.

Alternatively, an RFID tag is associated with each of the electrical ports in the power inverter and blocked by the connector. Upon removal of the connector, the RFID tag is detected and the appropriate action taken.

Consequently, by using a non-electrical sensing conductor or RFID tags, the emission of EMI from the HVIL sensing conductor of the power inverter is effectively eliminated.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIG. 4 is a diagrammatic side view illustrating a still further embodiment of the present invention;

FIG. 5 is a top view of FIG. 4;

DETAILED DESCRIPTION OF PREFERRED EMBODIMENTS OF THE PRESENT INVENTION

Figure 12:
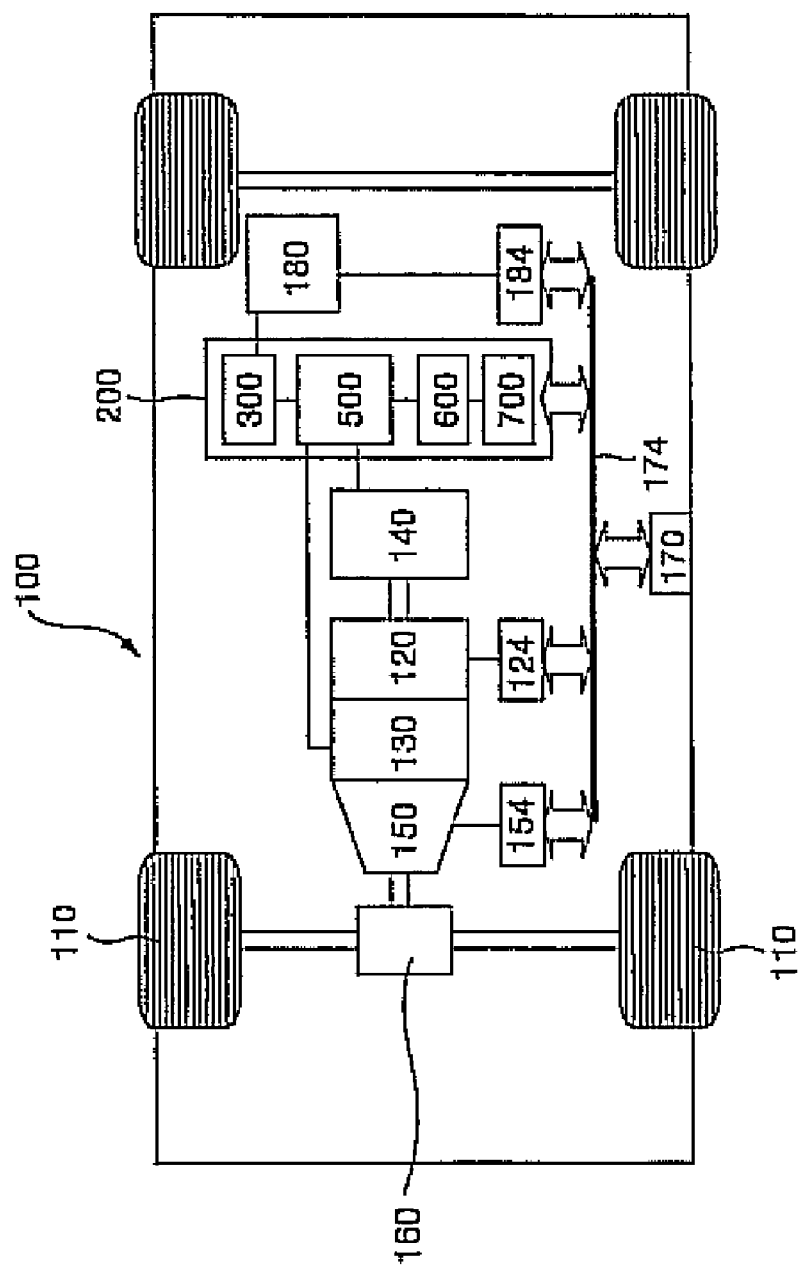
FIG. 12 is a diagrammatic view of a hybrid electric vehicle.

FIG. 12 is a structural view showing an embodiment of a hybrid-type electric automobile including the power converter of the invention. Incidentally, the power converter 200 of the invention is applicable to the pure electric automobile and the hybrid-type electric automobile, and the embodiment of the hybrid-type electric automobile is explained below.

On the hybrid-type electric automobile 100, an engine 120, the first rotary motor 130, the second rotary motor 140 and a battery 180 for supplying a direct current of high voltage to the first rotary motor 130 and the second rotary motor 140 are mounted. Further, a battery for supplying a low voltage electric current (14V electric power) is mounted to supply the direct current electric power to a control circuit described below, but it is not shown in the drawings.

A rotational torque by the engine 120, the first rotary motor 130 and the second rotary motor 140 are transmitted to a transmission 150 and a differential gear 160 to be transmitted to front wheels 110.

A transmission controller 154 for controlling the transmission 1507 an engine controller 124 for controlling the engine 120, the rotary motor control circuit on a rotary motor control circuit substrate 700 for controlling the power converter 200, a battery controller 184 for controlling a battery 180 of lithium ion battery or the like, and a main controller 170 are connected to each other by communication circuit lines 174.

The main controller 170 receives through the communication circuit lines 174 information indicating conditions of the transmission controller 154, the engine controller 124, the power converter 200 and the battery controller 184 as lower level controllers. On the basis of the information, the main controller 170 calculates controlling order for each controller to be transferred to each controller through the communication circuit lines 174. For example, the battery controller 184 reports to the main controller 170 electric discharge condition of the battery 180 of lithium ion battery and condition of each of unit cells constituting the lithium ion battery as conditions of the battery 150. When the main controller 170 decides that an electric charge of the battery 180 is necessary from the above report, the power converter is ordered to generate an electrical energy. Further, the main controller 170 manages output torques of the engine 120 and the first and second rotary motors 130 and 140, and calculates a total amount of or a torque distribution ratio among the output torques of the engine and the first and second rotary motors 130 and 140, so that control orders based on the calculation results are output to the transmission controller 154, the engine controller 124 and the power converter 200. The power controller 200 controls the first rotary motor 130 and the second control motor 140 on the basis of the torque order so that at least one of the rotary motors is controlled to generate the ordered torque output or the electric power.

The power converter 200 controls switching operation of a power semiconductor forming the inverter to operate the first rotary motor 130 and the second power converter 140 on the basis of the order from the main controller 170. By the switching operation of the power semiconductor, the first rotary motor 130 and the second power converter 140 are operated as motors or electric power generators.

When being operated as the motors, the direct current electric power is applied from the high-voltage battery 180 to the inverter of the power converter 200 while the switching operation of the power semiconductor forming the inverter is controlled to convert the direct current electric power to a three-phase alternating current to be supplied to the rotary motor 130 or 140. On the other hand, when being operated as the electric power generators, a rotor of the rotary motor 130 or 140 is rotated by a rotational torque supplied from the outside to generate the three-phase alternating current power on a stator of the rotary motor from the rotational torque. The generated three-phase alternating current power is converted by the power converter 200 to the direct current electric power to be supplied to the high voltage battery 150 so that the battery 180 is electrically charged by the direct current electric power.

As shown in FIG. 12, the power converter 200 is constituted by a capacitor module 300 including a plurality of smoothing capacitors for restraining a variation in voltage of the direct current electric source, a power module 500 including a plurality of the power semiconductors, a substrate (hereafter called as a switching drive circuit substrate) 600 including a switching drive circuit for controlling the switching operation of the power module, and a substrate (hereafter, called as a rotary motor control circuit substrate) 700 including a rotary motor control circuit for generating a PWM signal to control a pulse width modulation as a signal for determining a width of time period in the switching operation.

The high voltage battery 180 is the secondary battery of lithium ion battery or nickel hydride battery to generate the direct current electric power of high voltage not less than 250-600V.

Figure 1:
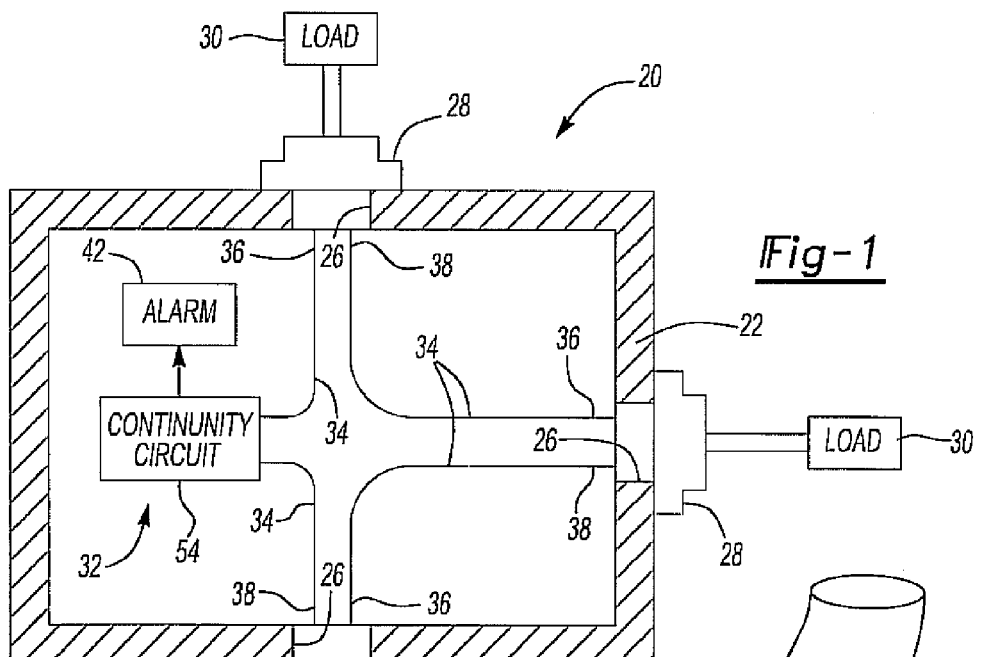
FIG. 1 is a diagrammatic view illustrating a first embodiment of the present invention.

With reference first to FIG. 1, a diagrammatic view of a power inverter 20 of the type used on electric vehicles, such as hybrid electric vehicles, is shown. The power inverter 20 includes a metal case 22 which defines an interior 24. Battery and switching circuitry contained within the interior 24 of the case 22 provide the electric power for the electric vehicle as well as other electrical vehicle systems. Some of these voltages, furthermore, may be both high voltage and high amperage.

At least one and more typically several electrical ports 26 are mounted to the power inverter case 22 to provide electrical power exteriorly of the case 22. Furthermore, a cable connector 28 is associated with each electrical port 26 for electrically connecting its associated port 26 to an exterior electrical load 30.

The electric current flow path between the case and the ground plane of the motor circuit board should be minimized to in turn minimize parasitic inductances between the case and the ground plane of the motor control board. Such parasitic inductances otherwise result in EMI at the high frequencies used in the power inverter 20.

With reference now to FIGS. 4 and 5, a motor control board 60 having a ground plane 61 is mounted to a base plate 62 by first metal fasteners 64. The base plate 62 is then secured to the metal case 22 of the power inverter by second metal fasteners 66 so that the fasteners 64 and 66 electrically connect the circuit board ground plane 61 to the case 22. The fasteners 64 and 66 may comprise screws, bolts, etc. A power module 68 for the power inverter 20 is also illustrated in FIG. 4.

As best shown in FIG. 5, in order to minimize the stray inductance between the ground plane for the motor control circuit board 60 and the power inverter case 22, the distance between the first fasteners 64 and the closest second fasteners 66 is minimized. For example, as shown in FIG. 5, the fasteners 64 are closely aligned with, and thus closely adjacent to, the second fasteners 66.

Figure 7:
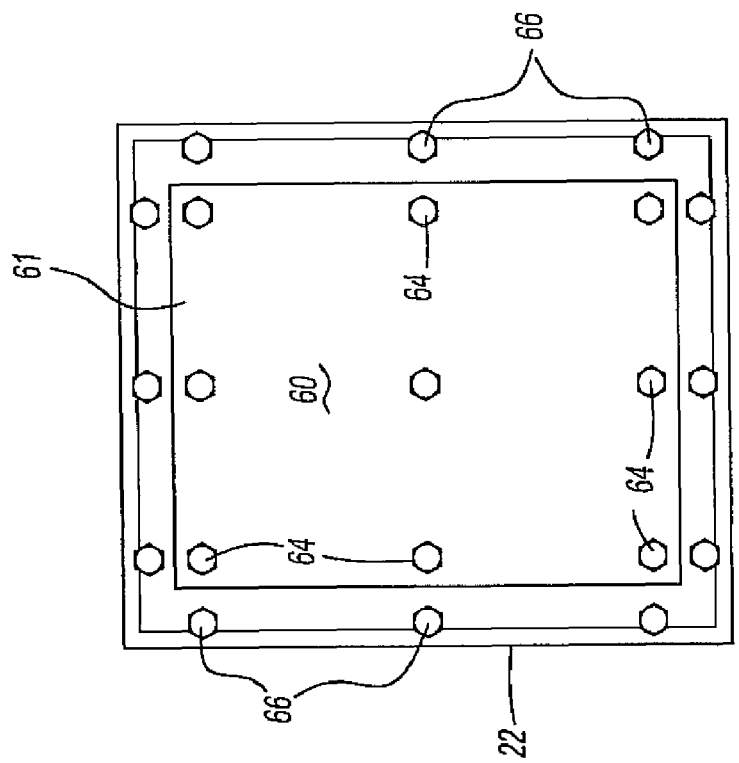
FIG. 7 is a top view of FIG. 6.
Figure 6:
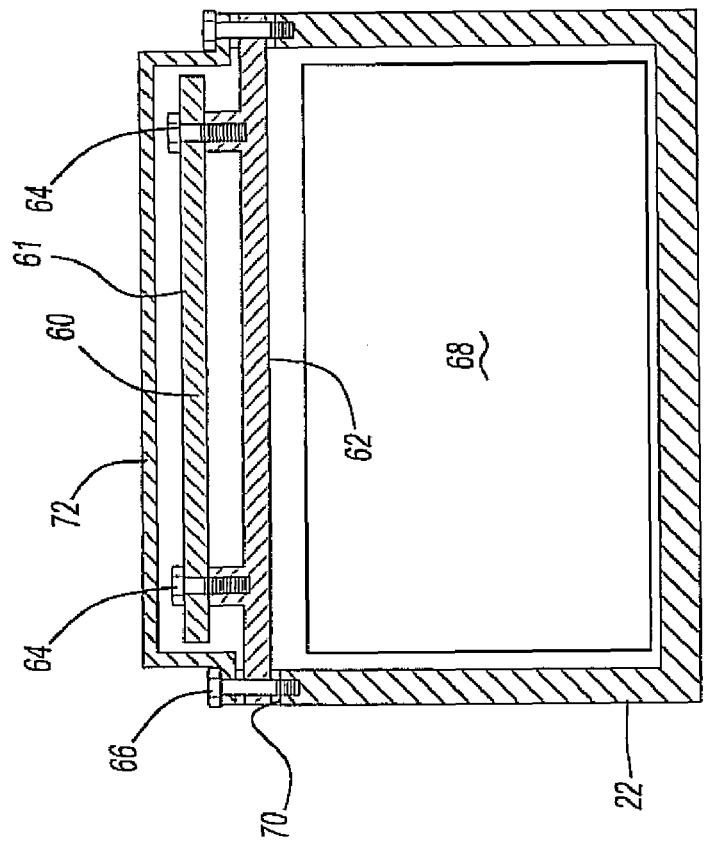
FIG. 6 is a view similar to FIG. 4, but illustrating a still further modification.

FIGS. 6 and 7 illustrate still a further form of minimizing the distance between the first fasteners 64 which secure the motor control circuit board 60 to the base plate 62 in which the base plate 62 overlies a top 70 of the case 22. A cover 72 is then secured over the motor control circuit board 60 and this cover 72 is secured directly to the case 22 by the second fasteners 66 which extend through the base plate 62 and directly into the case 22. In doing so, the fasteners 64 and 66 electrically connect the base plate 62, the circuit board ground plane 61 and the case 22 together thus minimizing stray inductances and the generation of EMI during the operation of the power inverter.

Figure 8:
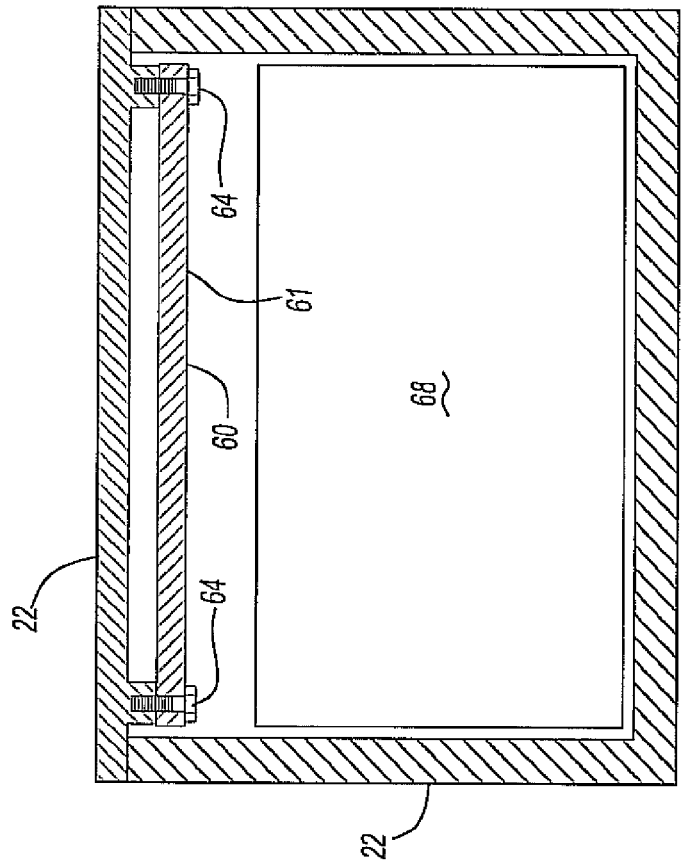
FIG. 8 is a view similar to FIG. 4, but illustrating a still further modification of the present invention.

With reference now to FIG. 8, a still further modification of the present invention is shown in which the motor circuit board 60 is mounted directly to the power inverter case 22 without the base plate 62 shown in the FIGS. 4-7 embodiments. Consequently, since the first fasteners 64 extend directly through the motor control board 60 and into the case 22, thus electrically connecting the circuit board ground plane 61 to the case 22, stray inductance between the case 22 and the motor control board 60 is minimized thus minimizing the generation of EMI.

Figure 9:
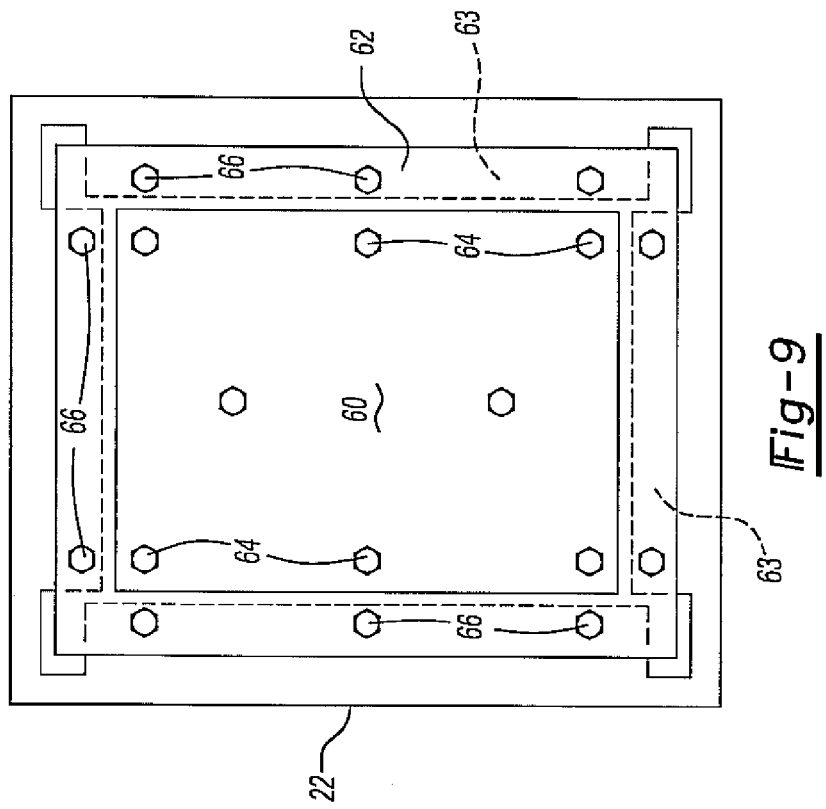
FIG. 9 is a top view similar to FIG. 5, but illustrating a still further modification of the present invention.

With reference now to FIG. 9, in order to further reduce the EMI emissions, the case 22 includes elongated ledges 63 which extend around the interior of the case 22 which flatly abut against the base plate 62. Thus, an elongated edge connection is provided between all four sides of the base plate 62 and the power inverter case 22. This elongated edge connection provides an improved ground between the base plate 62 and the case 22, and thus between the control circuit ground plane 61 and the case 22 thereby reducing stray inductances and the generation of EMI.

Figure 11:
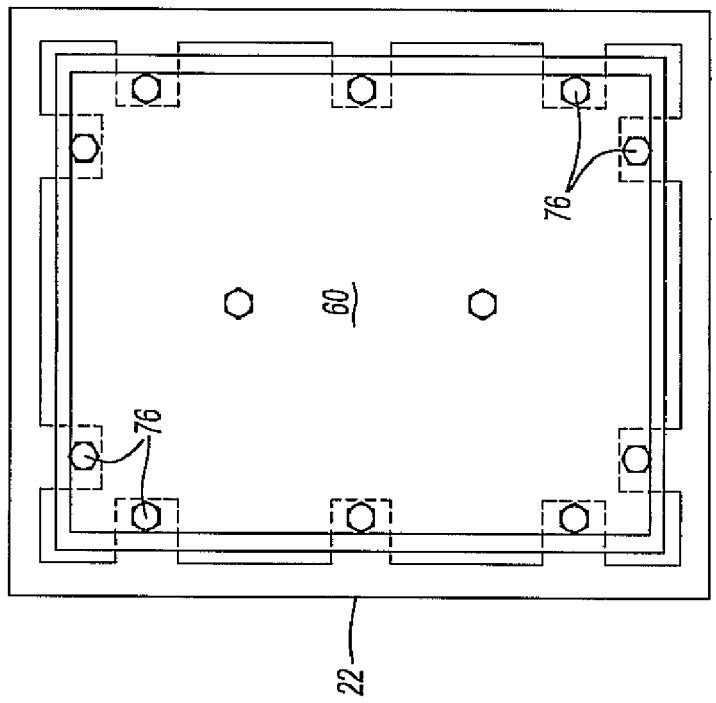
FIG. 11 is a top view of FIG. 10.
Figure 10:
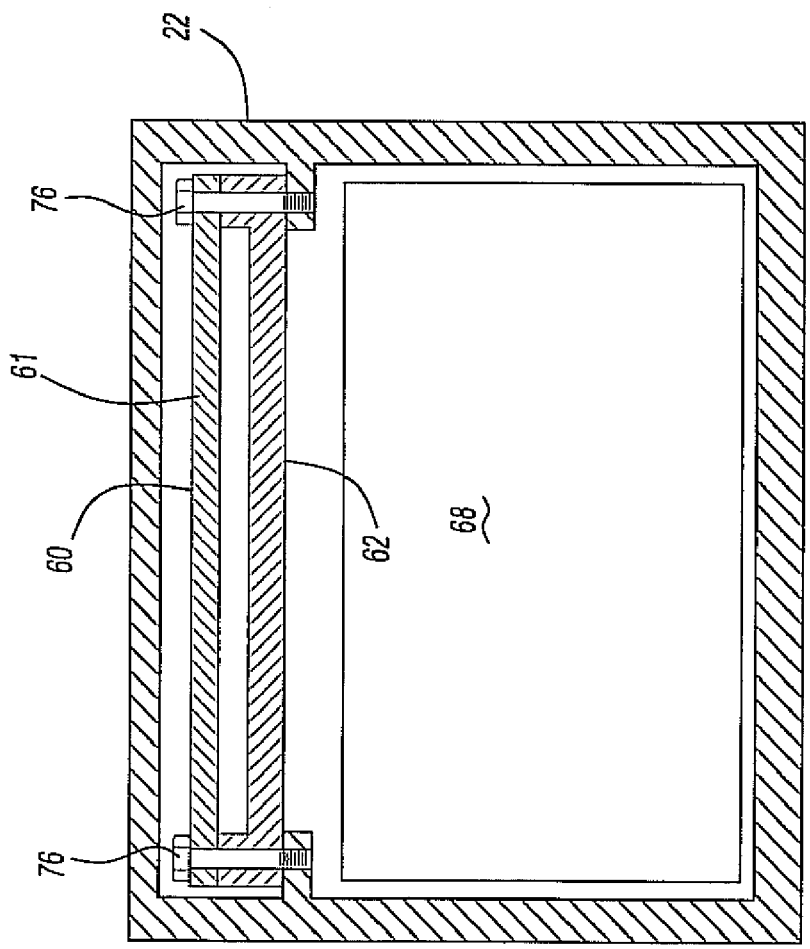
FIG. 10 is a view similar to FIG. 4, but illustrating a modification of the present invention.

With reference now to FIGS. 10 and 11, a still further modification of the present invention is shown in which a plurality of metal fasteners 76 are used to secure both the base plate 62 and motor control board 60 directly to the power inverter case 22. Unlike the previous embodiments of the invention, these fasteners 76 extend directly through the ground plane of the motor control board 60 and the base plate 62 and into the power inverter case 22. Consequently, the direct connection provided by the fasteners 26 minimizes and, indeed, virtually eliminates, all stray inductance thus reducing the emission of EMI from the power inverter.

A high voltage interlock (HVIL) system 32 is associated with the power inverter 20 to detect the absence or disconnection of any of the connectors 28. A non-electric sensing conductor 34, such as an optic fiber, extends from a continuity circuit 54 and serially through each of the electric ports 26. Two ends 36 and 38 of the optic fiber 34 terminate at each of the electrical ports 26 so that the ends 36 and 38 of the conductor 34 are optically disconnected at each port 26.

Figure 2:
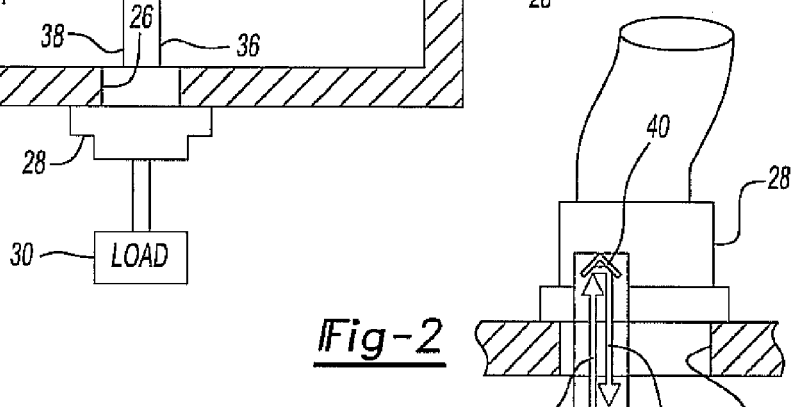
FIG. 2 is a fragmentary view of a portion of the preferred embodiment and enlarged for clarity.

With reference now to FIG. 2, in order to complete the optical circuit between the ends 36 and 38 of the non-electrical conductor 34 at each port 26, an optical coupler 40 such as a mirror or optic fiber segment is contained within the cable connector 28 for each port 26 and completes the optical circuit between the ends 36 and 38 of the conductor 34. Consequently, the absence or disconnection of a single cable connector 28 is sufficient to interrupt the optical path of the conductor 34 and the continuity circuitry 36 detects the interruption and generates the appropriate alarm 42 or other signal.

Since the conductor 34 is non-electrical, i.e. non-metallic, the switching magnetic fields within the interior of the power inverter case 22 cannot induce EMI producing eddy currents in the conductor 34.

Figure 3:
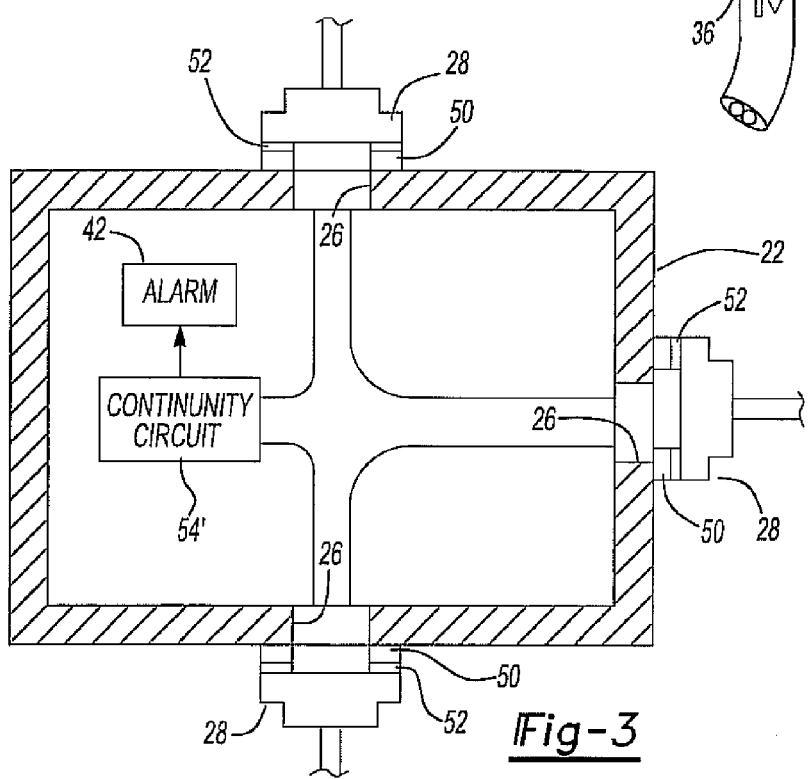
FIG. 3 is a view similar to FIG. 1, but illustrating a modification thereof.

With reference now to FIG. 3, a modification of the present invention is shown in which an RFID tag 50 is associated with each port 26 on the power inverter case 22 in lieu of the HVIL wire. Additionally, a metal shield 52 on each of the cable connectors 28 overlies and covers the RFID tag 50 on its associated electrical port 26 when properly attached. Consequently, upon removal of the cable connector 28 from its associated port 26, the RFID tag 50 is exposed and thus subject to excitation and detection by a modified continuity circuit 54'. Conversely, when all of the cable connectors 28 are attached to their associated ports 26 on the power inverter case 22, the cable connectors 28 shield the RFID tags 50 so that they cannot be detected by the continuity circuit 54.

From the foregoing, it can be seen that the present invention provides a simple and yet effective apparatus and method for reducing the emission of EMI from a power inverter of the type used on an electric vehicle, such as a hybrid electric vehicle. Having described our invention, however, many modifications thereto will become apparent to those skilled in the art to which it pertains without deviation from the spirit of the invention as defined by the scope of the appended claims.

We claim:

1. In a power inverter having a metal case and a control circuit board having a ground plane mounted in said case, a method for reducing electromagnetic interference generated from the power inverter contained in said case comprising the steps of:

positioning a metal base plate between said circuit board and said case, spacing first metal fasteners around an outer perimeter of said circuit board so that said first fasteners extend through and are electrically connected to said circuit board ground plane, securing said circuit board to said base plate by said first fasteners so that said first fasteners electrically connect said circuit board ground plane with said base plate, spacing second metal fasteners around an outer perimeter of said base plate so that said second fasteners are spaced outwardly from said first fasteners, securing said base plate to said case by second fasteners so that said second fasteners electrically connect said base plate with said case, and wherein said spacing said second fasteners step further comprises the step of minimizing the spacing between adjacent first and second fasteners.

2. The power inverter as defined in claim 1 comprising metal base plate between said circuit board and said case, and wherein said securing step comprises the step of securing said circuit board to said case by said plurality of first fasteners, each first fastener extending through said circuit board and base plate and into said case.

3. The power inverter as defined in claim 1 and further comprising the step of providing an elongated edge abutment between each side of said base plate and said case.

4. A power inverter construction for an electric automotive vehicle comprising:

a metal case,
a power inverter positioned in said case,
a control circuit board having a ground plane,
a metal base plate positioned between said control circuit board and said case,
a plurality of first metal fasteners extending through said control circuit board and into said base plate, said first fasteners electrically connecting said circuit board ground plane to said case base plate, and
a plurality of second metal fasteners extending through said base plate and into said case, said second fasteners electrically connecting said base plate to said case, said second fasteners being positioned closely adjacent said first fasteners so that said base plate shields said circuit board from electromagnetic radiation.

5. The invention as defined in claim 4 wherein said case includes at least one elongated ledge, said base plate flatly abutting against said elongated edge of said case to thereby increase an area of contact between said case and the control circuit board ground plane.

6. The invention as defined in claim 4 wherein said case includes a plurality of elongated ledges extending around an interior of said case, said base plate flatly abutting against said elongated edges of said case.

\* \* \* \* \*